(12) United States Patent
Watanabe et al.

(10) Patent No.: US 11,417,389 B2
(45) Date of Patent: Aug. 16, 2022

(54) LAYOUTS FOR SENSE AMPLIFIERS AND RELATED APPARATUSES AND SYSTEMS

(71) Applicant: Micron Technology, Inc., Boise, ID (US)

(72) Inventors: Yuko Watanabe, Tokyo (JP); Takefumi Shirako, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 22 days.

(21) Appl. No.: 16/917,233

(22) Filed: Jun. 30, 2020

(65) Prior Publication Data
US 2021/0407578 A1    Dec. 30, 2021

(51) Int. Cl.
*G11C 11/4091*    (2006.01)

(52) U.S. Cl.
CPC ................ *G11C 11/4091* (2013.01)

(58) Field of Classification Search
CPC .................................. G11C 11/4091
USPC ....................................... 365/207
See application file for complete search history.

(56) References Cited

U.S. PATENT DOCUMENTS

| | | | | |
|---|---|---|---|---|
| 5,325,335 A * | 6/1994 | Ang | ................ | G11C 11/419 365/208 |
| 5,796,273 A * | 8/1998 | Jung | ................ | G11C 11/5621 327/55 |
| 9,947,385 B1 * | 4/2018 | Choi | ................ | G11C 11/4076 |
| 2003/0185076 A1 * | 10/2003 | Worley | ................ | G11C 7/065 365/207 |
| 2016/0163359 A1 * | 6/2016 | Kim | ................ | G11C 11/4094 365/189.11 |
| 2019/0237114 A1 * | 8/2019 | Won | ................ | G11C 11/4099 |
| 2020/0075064 A1 * | 3/2020 | Kenyon | ................ | G11C 7/065 |

OTHER PUBLICATIONS

Kyoichi, Nagata, U.S. Appl. No. 16/678,394, titled Cross-Coupled Transistor Threshold Voltage Mismatch Compensation and Related Devices, Systems, and Methods, filed Nov. 8, 2019.

* cited by examiner

*Primary Examiner* — Sung Il Cho
(74) *Attorney, Agent, or Firm* — TraskBritt

(57) ABSTRACT

Electrically conductive line side-by-side running distance equalization and related apparatuses and systems. An apparatus includes a first sense amplifier including a first pull-up sense amplifier, a first pull-down sense amplifier, and a first pair of lines connecting the first pull-up sense amplifier to the first pull-down sense amplifier. The apparatus also includes a second sense amplifier adjacent to the first sense amplifier. The second sense amplifier includes a second pull-up sense amplifier, a second pull-down sense amplifier, and a second pair of lines connecting the second pull-up sense amplifier to the second pull-down sense amplifier. Parallel running distances between lines of the first pair of lines and the second pair of lines are equalized by a wiring twist of at least one of the first pair of lines or the second pair of lines in a region of the first pull-up sense amplifier and the second pull-up sense amplifier.

20 Claims, 11 Drawing Sheets

US 11,417,389 B2

LAYOUTS FOR SENSE AMPLIFIERS AND RELATED APPARATUSES AND SYSTEMS

TECHNICAL FIELD

The present disclosure relates generally to semiconductor chip layouts for sense amplifiers, and more specifically to routing of electrically conductive lines connecting pull-up and pull-down sense amplifiers in memory devices.

BACKGROUND

Sense amplifiers that are used to detect data stored in memory elements (e.g., capacitive memory elements in Dynamic Random-Access Memory (DRAM)) sometimes include cross-coupled transistors. The cross-coupled transistors may enable detection of relatively small amounts of charge stored by the memory elements. In some instances, however, the transistors of the cross-coupled pair of transistors may have mismatched threshold voltages. In these instances, a relatively large charge or discharge current on the bit line may result due to the mismatched threshold voltages of the transistors in the cross-coupled pair of transistors. Also, due to increased capacitance and resistance of bit lines resulting from increased numbers of data charge storage elements being coupled to bit lines, a relatively large amount of time may pass as the bit line charges or discharges. In instances where sufficient time is not allotted to fully charge or discharge the bit line, sense margin deficiencies may occur.

U.S. patent application Ser. No. 16/678,394, filed Nov. 8, 2019, and titled CROSS-COUPLED TRANSISTOR THRESHOLD VOLTAGE MISMATCH COMPENSATION AND RELATED DEVICES, SYSTEMS, AND METHODS, discloses sense amplifier circuitry that may be used to compensate for mismatched threshold voltages of cross-coupled pairs of transistors in sense amplifiers.

BRIEF DESCRIPTION OF THE DRAWINGS

While this disclosure concludes with claims particularly pointing out and distinctly claiming specific embodiments, various features and advantages of embodiments within the scope of this disclosure may be more readily ascertained from the following description when read in conjunction with the accompanying drawings, in which:

DETAILED DESCRIPTION

Figure 1:
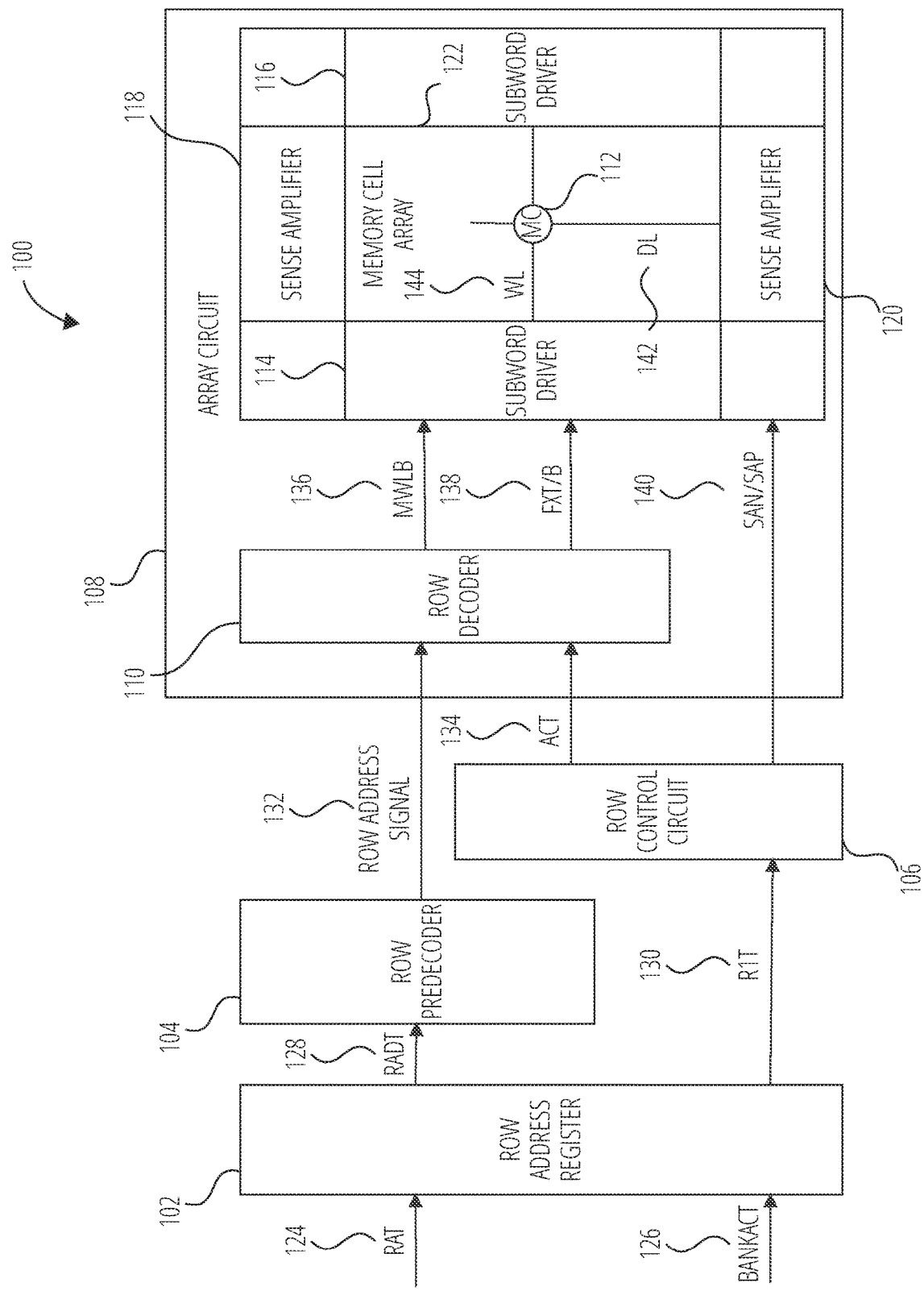
FIG. 1 is a block diagram of a portion of a memory device, according to some embodiments.

In the following detailed description, reference is made to the accompanying drawings, which form a part hereof, and in which are shown, by way of illustration, specific examples of embodiments in which the present disclosure may be practiced. These embodiments are described in sufficient detail to enable a person of ordinary skill in the art to practice the present disclosure. However, other embodiments enabled herein may be utilized, and structural, material, and process changes may be made without departing from the scope of the disclosure.

The illustrations presented herein are not meant to be actual views of any particular method, system, device, or structure, but are merely idealized representations that are employed to describe the embodiments of the present disclosure. In some instances similar structures or components in the various drawings may retain the same or similar numbering for the convenience of the reader; however, the similarity in numbering does not necessarily mean that the structures or components are identical in size, composition, configuration, or any other property.

The following description may include examples to help enable one of ordinary skill in the art to practice the disclosed embodiments. The use of the terms "exemplary," "by example," and "for example," means that the related description is explanatory, and though the scope of the disclosure is intended to encompass the examples and legal equivalents, the use of such terms is not intended to limit the scope of an embodiment or this disclosure to the specified components, steps, features, functions, or the like.

It will be readily understood that the components of the embodiments as generally described herein and illustrated in the drawings could be arranged and designed in a wide variety of different configurations. Thus, the following description of various embodiments is not intended to limit the scope of the present disclosure, but is merely representative of various embodiments. While the various aspects of the embodiments may be presented in the drawings, the drawings are not necessarily drawn to scale unless specifically indicated.

Furthermore, specific implementations shown and described are only examples and should not be construed as the only way to implement the present disclosure unless specified otherwise herein. Elements, circuits, and functions may be shown in block diagram form in order not to obscure the present disclosure in unnecessary detail. Conversely, specific implementations shown and described are exemplary only and should not be construed as the only way to implement the present disclosure unless specified otherwise herein. Additionally, block definitions and partitioning of logic between various blocks is exemplary of a specific implementation. It will be readily apparent to one of ordinary skill in the art that the present disclosure may be practiced by numerous other partitioning solutions. For the most part, details concerning timing considerations and the like have been omitted where such details are not necessary to obtain a complete understanding of the present disclosure and are within the abilities of persons of ordinary skill in the relevant art.

Those of ordinary skill in the art will understand that information and signals may be represented using any of a variety of different technologies and techniques. Some drawings may illustrate signals as a single signal for clarity of presentation and description. It will be understood by a person of ordinary skill in the art that the signal may represent a bus of signals, wherein the bus may have a variety of bit widths and the present disclosure may be implemented on any number of data signals including a single data signal.

The various illustrative logical blocks, modules, and circuits described in connection with the embodiments disclosed herein may be implemented or performed with a general purpose processor, a special purpose processor, a digital signal processor (DSP), an Integrated Circuit (IC), an Application Specific Integrated Circuit (ASIC), a Field Programmable Gate Array (FPGA) or other programmable logic device, discrete gate or transistor logic, discrete hardware components, or any combination thereof designed to perform the functions described herein. A general-purpose processor (may also be referred to herein as a host processor or simply a host) may be a microprocessor, but in the alternative, the processor may be any conventional processor, controller, microcontroller, or state machine. A processor may also be implemented as a combination of computing devices, such as a combination of a DSP and a microprocessor, a plurality of microprocessors, one or more microprocessors in conjunction with a DSP core, or any other such configuration. A general-purpose computer including a processor is considered a special-purpose computer while the general-purpose computer is configured to execute computing instructions (e.g., software code) related to embodiments of the present disclosure.

The embodiments may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be re-arranged. A process may correspond to a method, a thread, a function, a procedure, a subroutine, a subprogram, other structure, or combinations thereof. Furthermore, the methods disclosed herein may be implemented in hardware, software, or both. If implemented in software, the functions may be stored or transmitted as one or more instructions or code on computer-readable media. Computer-readable media includes both computer storage media and communication media including any medium that facilitates transfer of a computer program from one place to another.

Any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. In addition, unless stated otherwise, a set of elements may include one or more elements.

As used herein, the term "substantially" in reference to a given parameter, property, or condition means and includes to a degree that one of ordinary skill in the art would understand that the given parameter, property, or condition is met with a small degree of variance, such as, for example, within acceptable manufacturing tolerances. By way of example, depending on the particular parameter, property, or condition that is substantially met, the parameter, property, or condition may be at least 90% met, at least 95% met, or even at least 99% met.

As used herein, the term "semiconductor material" refers to a material having a conductivity between those of electrically insulating materials and electrically conductive materials. For example, a semiconductor material may have a conductivity of between about $10^{-8}$ Siemens per centimeter (S/cm) and $10^4$ S/cm at room temperature (e.g., substantially twenty degrees centigrade). Examples of semiconductor materials include element semiconductor materials found in column IV of the period table of elements such silicon (Si), germanium (Ge), and carbon (C). Other examples of semiconductor materials include compound semiconductor materials such as binary compound semiconductor materials (e.g., gallium arsenide (GaAs)), ternary compound semiconductor materials (e.g., $Al_XGa_{1-X}As$), and quaternary compound semiconductor materials (e.g., $Ga_XIn_{1-X}As_YP_{1-Y}$), without limitation. Compound semiconductor materials may include combinations of elements from columns III and V of the period table of elements (III-V semiconductor materials) or from columns II and VI of the period table of elements (II-VI semiconductor materials), without limitation. Semiconductor devices often include crystalline semiconductor materials. By way of non-limiting examples, transistors and diodes include crystalline semiconductor materials. Accordingly, the term "semiconductor material," as used herein, refers specifically to crystalline semiconductor materials unless explicitly indicated otherwise herein.

As used herein, the term "intrinsic semiconductor material" refers to a semiconductor material having a relatively small density of impurities (e.g., a lower density of impurities than electron and hole densities resulting from thermal generation at room temperature).

As used herein, the term "doped semiconductor material" refers to a semiconductor material having a higher density of impurities introduced thereto than intrinsic semiconductor materials (e.g., a higher density of impurities than electron and hole densities resulting from thermal generation at room temperature). A doped semiconductor material may be doped predominantly with donor impurities such as phosphorus (P), antimony (Sb), bismuth (Bi), and arsenic (As), without limitation. Each donor impurity in a crystal lattice of semiconductor material adds a free electron, which increases the conductivity of the semiconductor material relative to the intrinsic form of the semiconductor material. Doped semiconductor materials that have been doped predominantly with donor impurities are referred to herein as "N-type semiconductor materials." A doped semiconductor may instead be doped predominantly with trivalent or acceptor impurities such as boron (B), indium (In), aluminum (Al), and gallium (Ga), without limitation. Each trivalent or acceptor impurity in a crystal lattice of semiconductor material adds an electron hole (referred to herein as "hole"), which increases the conductivity of the semiconductor material relative to the intrinsic form of the semiconductor material. Doped semiconductor materials that have been doped predominantly with trivalent or acceptor impurities are referred to herein as "P-type semiconductor materials."

As used herein, the terms "active material" or "diffusion material" refers to a semiconductor material that has been doped to function as a channel material in a metal oxide semiconductor (MOS) field effect transistor (FET) (MOSFET). A MOSFET transistor having a channel material that has been doped predominantly with donor impurities is referred to herein as an N-type MOS (NMOS) transistor because the active material serving as the channel material for the NMOS transistor includes N-type semiconductor material. Similarly, a MOSFET transistor having a channel material that has been doped predominantly with trivalent or acceptor impurities is referred to herein as a P-type MOS (PMOS) transistor because the active material serving as the channel material for the PMOS transistor includes P-type semiconductor material.

Due to factors such as side-by-side lengths of electrically conductive lines (e.g., GUT lines), which may result in large capacitive coupling between the lines, and small capacitance of memory elements, sense operations performed by sense amplifiers (e.g., threshold voltage potential compensation sense amplifiers) may be difficult. Disclosed herein are sense amplifiers having electrically conductive lines having equalized side-by-side running distances to reduce noise variation on the lines. This side-by-side running distance between the electrically conductive lines may be implemented using wiring twists between the conductive lines. Equalization of side-by-side running distances between electrically conductive lines may result in reduction of data pattern dependence of noise variation, as compared to non-equalized sense amplifiers.

In some embodiments an apparatus includes a first sense amplifier and a second sense amplifier adjacent to the first sense amplifier. The first sense amplifier includes a first pull-up sense amplifier, a first pull-down sense amplifier, and a first pair of lines including electrically conductive material. The first pair of lines electrically connects the first pull-up sense amplifier to the first pull-down sense amplifier. The second sense amplifier includes a second pull-up sense amplifier, a second pull-down sense amplifier, and a second pair of lines including electrically conductive material. The second pair of lines electrically connects the second pull-up sense amplifier to the second pull-down sense amplifier. Parallel running distances between lines of the first pair of lines and the second pair of lines are equalized by a wiring twist of at least one of the first pair of lines or the second pair of lines in a region of the first pull-up sense amplifier and the second pull-up sense amplifier.

In some embodiments an apparatus includes a region of pull-up sense amplifiers, a region of pull-down sense amplifiers, a first line, a second line, a third line, and a fourth line. The region of pull-up sense amplifiers includes a first pull-up sense amplifier and a second pull-up sense amplifier. The region of pull-down sense amplifiers includes a first pull-down sense amplifier and a second pull-down sense amplifier. The first line includes electrically conductive material. The first line electrically connects the first pull-up sense amplifier to the first pull-down sense amplifier. The second line includes electrically conductive material. The second line electrically connects the first pull-up sense amplifier to the first pull-down sense amplifier. The first line and the second line include two wiring twists between the first line and the second line in the region of the pull-up sense amplifiers. The third line includes electrically conductive material. The third line electrically connects the second pull-up sense amplifier to the second pull-down sense amplifier. The fourth line includes electrically conductive material. The fourth line electrically connects the second pull-up sense amplifier to the second pull-down sense amplifier. The third line and the fourth line include only one wiring twist between the third line and the fourth line in the region of the pull-up sense amplifiers.

In some embodiments a computing system includes one or more processors and one or more memory devices electrically connected to the one or more processors. The one or more memory devices include a region of pull-up sense amplifiers including a first pull-up sense amplifier and a second pull-up sense amplifier. The one or more memory devices also include a region of pull-down sense amplifiers including a first pull-down sense amplifier and a second pull-down sense amplifier. The one or more memory devices further include a first line and a second line including electrically conductive material. The first line and the second line electrically connect the first pull-up sense amplifier to the first pull-down sense amplifier. The one or more memory devices also include a third line and a fourth line comprising electrically conductive material. The third line and the fourth line electrically connect the second pull-up sense amplifier to the second pull-down sense amplifier. Side-by-side running distances between the first line, the second line, the third line and the fourth line are equalized by one or more wiring twists at least one of between the first line and the second line and between the third line and the fourth line.

FIG. 1 is a block diagram of a portion 100 of a memory device, according to some embodiments. The memory device includes a row address register 102, a row predecoder 104, a row control circuit 106, and an array circuit 108. The array circuit 108 includes a row decoder 110, subword drivers (e.g., subword driver 114 and subword driver 116), a memory cell array 122, and sense amplifiers (e.g., sense amplifier 118 and sense amplifier 120). The memory cell array 122 includes memory cells (e.g., memory cell 112) at intersections of word lines (e.g., word line 144) and digit lines (e.g., digit line 142).

The row address register 102 is configured to receive a row address signal (RAT 124) and a bank ACT signal (BankACT 126), and provide a row address signal (RADT 128) and a row activating signal (R1T 130). The row predecoder 104 is configured to receive the RADT 128 and provide a row address signal 132 to the row decoder 110. The row control circuit 106 is configure to receive the R1T 130 and provide an ACT signal (ACT 134) and N-type and P-type sense amplifier isolation signals (SAN/SAP 140) to the array circuit 108. The row decoder 110 is configured to receive the row address signal 132 and the ACT 134, and provide a word line activation signal (MWLB 136) and a word line driving signal (FXT/B 138) to the subword drivers (subword driver 114 and/or subword driver 116). The sense amplifiers are configured to receive the SAN/SAP 140 and perform sense operations to detect charge states of each memory cell 112 in the memory cell array 122. In some embodiments the sense amplifier 118 and the sense amplifier 120 may include threshold voltage compensation sense amplifiers.

Figure 2:
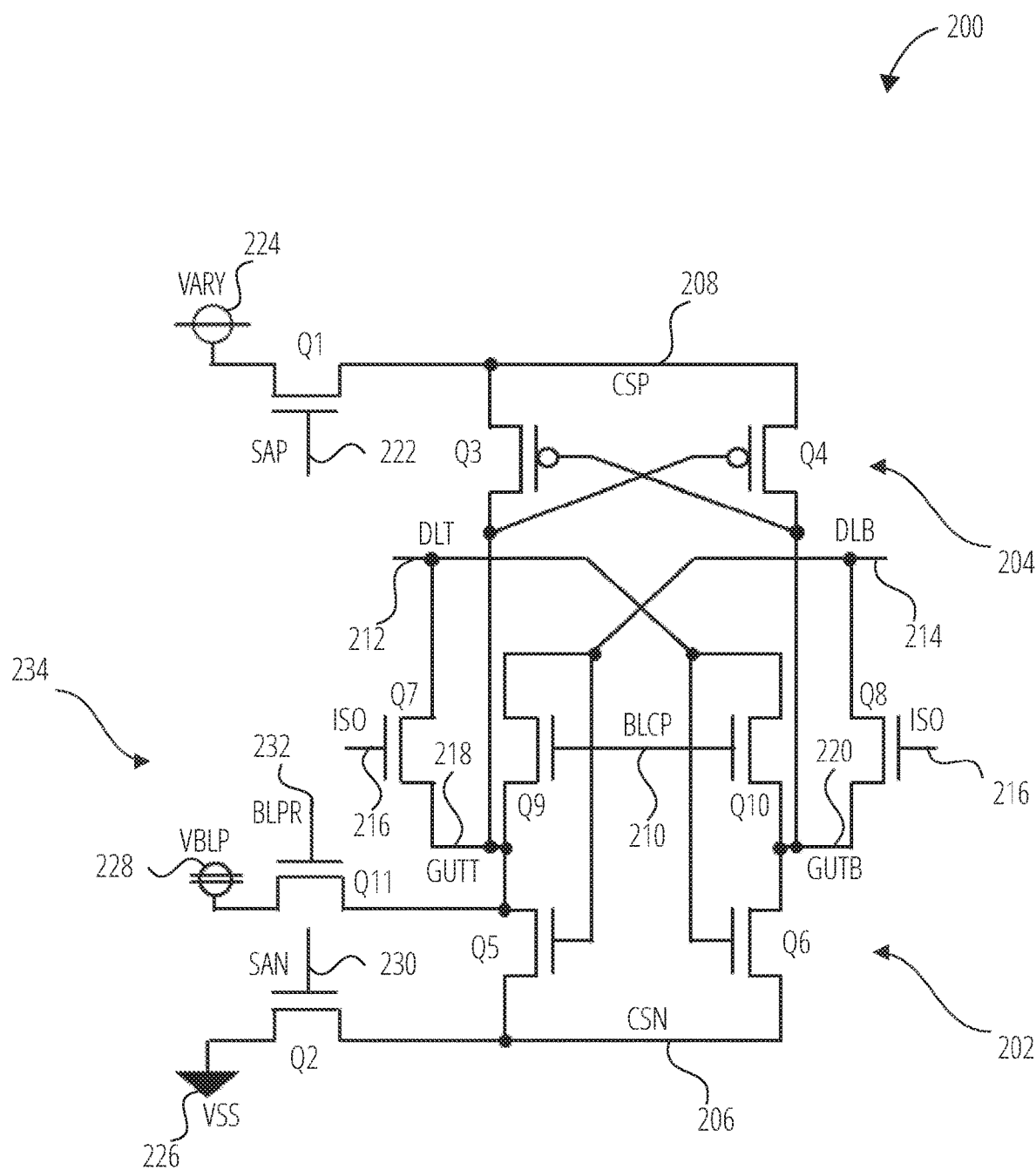
FIG. 2 is a circuit schematic illustration of sense amplifier circuitry of the portion of the memory device of FIG. 1, according to some embodiments.

FIG. 2 is a circuit schematic illustration of sense amplifier circuitry 200 of the portion 100 of the memory device of FIG. 1, according to some embodiments. By way of non-limiting example, the sense amplifier 118 and/or the sense amplifier 120 of the portion 100 of FIG. 1 may include the sense amplifier circuitry 200. The sense amplifier circuitry 200 includes transistors Q1-Q11. Transistors Q1, Q2, and Q5-Q11 are illustrated as NMOS transistors and transistors Q3 and Q4 are illustrated as PMOS transistors.

The sense amplifier circuitry 200 includes a pull-down sense amplifier 202 and a pull-up sense amplifier 204. The pull-down sense amplifier 202 includes transistor Q5 and transistor Q6. The pull-down sense amplifier 202 is configured to amplify signals read from memory cells (e.g., memory cell 112 of FIG. 1) electrically connected to a first digit line 212 (first digit line signal DLT on the first digit line 212 in FIG. 2) and a second digit line 214 (second digit line signal DLB in FIG. 2). A gate of transistor Q5 is electrically connected to the second digit line 214, and a gate of transistor Q6 is electrically connected to the first digit line 212. A drain of transistor Q5 is electrically connected to a GUTT line 218, and a drain of transistor Q6 is electrically connected to a GUTB line 220. Sources of transistors Q5 and Q6 are electrically connected to an N-type common source line 206. An N-type common source line signal CSN may be measured at the N-type common source line 206.

The sense amplifier circuitry 200 includes a power low voltage potential line 226 selectively electrically connected to the N-type common source line 206 via transistor Q2. A gate of transistor Q2 is electrically connected to an N-type sense amplifier isolation line 230. Responsive to an assertion of an N-type sense amplifier isolation signal SAN on the N-type sense amplifier isolation line 230 (e.g., a transition from a logic level low voltage potential to a logic level high voltage potential in the case that transistor Q2 is an NMOS transistor), the N-type common source line 206 is electrically connected to the power low voltage potential line 226 and power low voltage potential VSS is provided to the N-type common source line 206. Accordingly, transistors Q5 and Q6 may be pull-down transistors.

The pull-up sense amplifier 204 includes transistors Q3 and Q4. A drain of transistor Q3 is electrically connected to the GUTT line 218, and a drain of transistor Q4 is electrically connected to the GUTB line 220. Sources of transistors QS10 and QS11 are operably coupled to a common source line ACT. A gate of transistor Q3 is electrically connected to the GUTB line 220, and a gate of transistor Q4 is electrically connected to the GUTT line 218. Accordingly, transistors Q3 and Q4 may be cross-coupled transistors.

The sense amplifier circuitry 200 includes a power high voltage potential line 224 selectively electrically connectable to the P-type common source line 208 via transistor Q1. A P-type common source line signal CSP may be measured at the P-type common source line 208. A gate of transistor Q1 is electrically connected to a P-type sense amplifier isolation line 222. Responsive to an assertion of a P-type sense amplifier isolation signal SAP on the P-type sense amplifier isolation line 222 (e.g., a transition from a logic level low voltage potential to a logic level high voltage potential in the case that transistor Q1 is an NMOS transistor), the P-type common source line 208 is electrically connected to the power high voltage potential line 224 and a power high voltage potential VARY is provided to the P-type common source line 208. Accordingly, transistors Q3 and Q4 may be pull-up transistors.

The sense amplifier circuitry 200 further includes pre-charge circuitry 234 configured to pre-charge the GUTB line 220 and the GUTT line 218 prior to sensing the digit lines (first digit line 212 and second digit line 214) during a read operation. The pre-charge circuitry 234 includes transistors Q7 and Q8 configured selectively electrically connect and isolate the GUTT line 218 to and from the first digit line 212 and the GUTB line 220 to and from the second digit line 214. Gates of transistors Q7 and Q8 are electrically connected to a sense amplifier isolation line 216. Accordingly, isolation or connection between the GUTT line 218 and the first digit line 212, and between the GUTB line 220 and the second digit line 214 is controlled by asserting a sense amplifier isolation signal ISO on the sense amplifier isolation line 216.

The pre-charge circuitry 234 also includes transistor Q11 electrically connected between the GUTT line 218 and a pre-charge voltage potential line 228. The pre-charge voltage potential line 228 is configured to provide a pre-charge voltage potential VBLP to the GUTB line 220 to pre-charge the GUTB line 220 and the GUTT line 218 prior to sensing the first digit line 212 and the second digit line 214 during a read operation. A gate of transistor Q11 is electrically connected to digit line pre-charge control line 232. Accordingly, connection and isolation of the GUTB line to and from the pre-charge voltage potential line 228 may be controlled by asserting a digit line pre-charge control signal BLPR on the digit line pre-charge control line 232.

The pre-charge circuitry 234 further includes transistors Q9 and Q10. Transistor Q9 is electrically connected between the second digit line 214 and the GUTT line 218. Transistor Q10 is electrically connected between the first digit line 212 and the GUTB line 220. Gates of transistors Q9 and Q10 are electrically connected to a digit line pre-charge control line 210. Accordingly, connection and isolation between the second digit line 214 and the GUTT line 218, and between the first digit line 212 and the GUTB line 220 may be controlled by asserting digit line pre-charge control signal BLCP on the digit line pre-charge control line 210. With the gates of transistors Q9 and Q10 asserted, transistors Q5 and Q6 are effectively cross-coupled transistors.

As previously mentioned, transistors Q3 and Q4 are cross-coupled transistors, and transistors Q5 and Q6 are sometimes cross-coupled transistors (e.g., when the gates of transistors Q9 and Q10 are asserted). In some instances, threshold voltage potentials of the cross-coupled transistors may be mismatched. In such instances, a relatively large charge or discharge current on the digit lines (e.g., the first digit line 212 and the second digit line 214) may result. Also, due to increased capacitance and resistance of digit lines resulting from increased numbers of data charge storage elements being coupled to bit lines as higher-density memory device become more prevalent, a relatively large amount of time may pass as the digit lines charge or discharge. In instances where sufficient time is not allotted to fully charge or discharge the digit lines, sense margin deficiencies may occur. Accordingly, the sense amplifier circuitry 200 is configured to compensate for threshold voltage potential mismatches of cross-coupled transistors (e.g., of transistors Q3 and Q4, and transistors Q5 and Q6).

It should be noted that transistors Q1, Q2, and Q7-Q11 may be either NMOS or PMOS transistors. Accordingly, if any one of these transistors is an NMOS transistor, asserting the gate involves providing a voltage potential to the gate thereof that is at least a threshold voltage potential above the source voltage potential, switching the transistor into a saturation mode to electrically connect the source thereof to the drain thereof. Equally, if any one of these transistors is a PMOS transistor, asserting the gate involves providing a voltage potential to the gate thereof that is at least a threshold voltage potential below the source voltage potential, switching the transistor into a saturation mode to electrically connect the source thereof to the drain thereof. Accordingly, wherever herein it is discussed that a signal at the gate of a transistor is asserted, for PMOS transistors this assertion of the transistor may include providing a logic level low voltage potential to the gate and for NMOS transistors this assertion may include providing a logic level high voltage potential to the gate. Also, "turning on" a transistor refers to applying appropriate voltage potentials to the gate, source, and drain to operate the transistor in the saturation mode in which the source and drain nodes are electrically connected to each other. Further, "turning off" a transistor refers to applying appropriate voltage potentials to the gate, source, and drain to operate the transistor in a cutoff mode during which the transistor conducts negligible current between the source and the drain.

Figure 3:
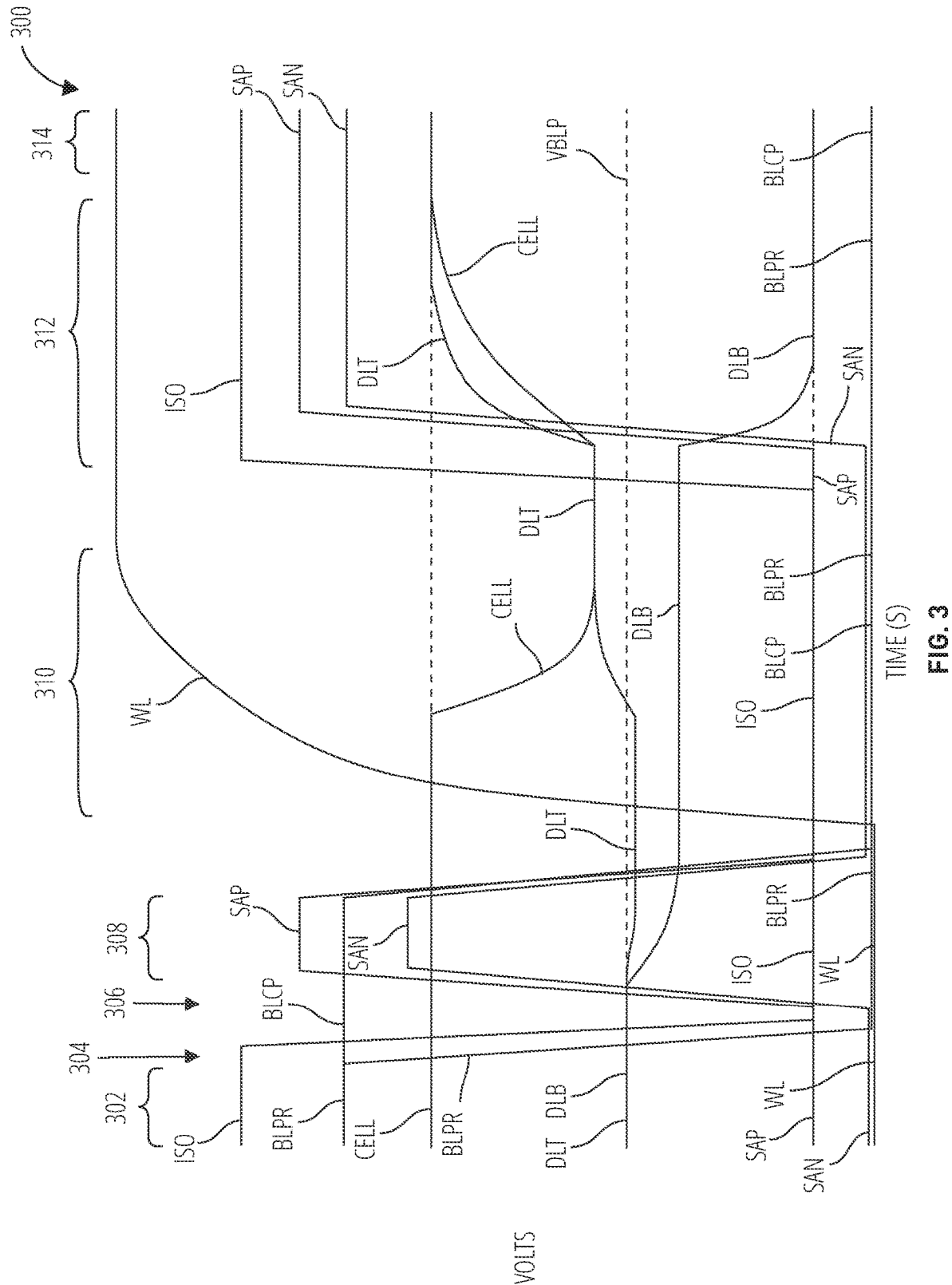
FIG. 3 is a signal timing diagram of examples of signals of the sense amplifier circuitry of FIG. 2, according to some embodiments.

FIG. 3 is a signal timing diagram 300 of examples of signals of the sense amplifier circuitry 200 of FIG. 2, according to some embodiments. The signals of the signal timing diagram 300 are shown in volts plotted against time. The signal timing diagram 300 includes the first digit line signal DLT, the second digit line signal DLB, the digit line pre-charge control signals BLPR and BLCP, the sense amplifier isolation signal ISO, the P-type sense amplifier isolation signal SAP, and the N-type sense amplifier isolation signal SAN of FIG. 2. The signal timing diagram 300 also includes a word line signal WL (e.g., on the word line 144 of FIG. 1) and a cell voltage potential signal CELL (e.g., at the memory cell 112 of FIG. 1).

Referring to FIG. 2 and FIG. 3 together, the signal timing diagram 300 is illustrated over several periods of time. For example, the signal timing diagram 300 includes a pre-charge period of time 302, a pre-sense period of time 308, a memory cell connection period of time 310, an amplification period of time 312, and a read period of time 314.

During the pre-charge period of time 302 the pre-charge control signals BLPR and BLCP and the sense amplifier isolation signal ISO are asserted (e.g., set to high logic levels since transistors Q7-Q11 are NMOS transistors). As a result, the GUTT line 218 and the GUTB line 220 are electrically connected to the first digit line 212, the second digit line 214, and the pre-charge voltage potential line 228. Consequently the first digit line signal DLT, the second digit line signal DLB, the GUTT signal (not shown in FIG. 3), and the GUTB signal (not shown in FIG. 3) are pre-charged to the pre-charge voltage potential VBLP. FIG. 3 shows the first digit line signal DLT and the second digit line signal DLB at the pre-charge voltage potential VBLP during the pre-charge period of time 302.

Responsive to an ACT command 304 the sense amplifier isolation signal ISO and the pre-charge control signal BLPR are deasserted (transitioned from high logic levels to low logic levels in FIG. 3 since Q7, Q8, and Q11 are NMOS transistors). Accordingly, the GUTT line 218, the GUTB line 220, the first digit line 212, and the second digit line 214 are electrically isolated from the pre-charge voltage potential line 228, the first digit line 212 is electrically isolated from the GUTT line 218, and the second digit line 214 is electrically isolated from the GUTB line 220. The pre-charge control signal BLCP remains asserted. Accordingly, the first digit line 212 remains electrically connected to the GUTB line 220 and the second digit line 214 remains electrically connected to the GUTT line 218.

Responsive to a sense command 306 the N-type sense amplifier isolation signal SAN and the P-type sense amplifier isolation signal SAP are asserted, and remain asserted during a pre-sense period of time 308. Accordingly, the P-type common source line 208 is electrically connected to the power high voltage potential line 224 and the N-type common source line 206 is electrically connected to the power low voltage potential line 226 during the pre-sense period of time 308. Consequently, the N-type common source line signal CSN may transition low (not shown) and the P-type common source line signal CSP may transition high (not shown), powering the pull-down sense amplifier 202 and the pull-up sense amplifier 204. The pull-down sense amplifier 202 and the pull-up sense amplifier 204 drive the first digit line signal DLT and the second digit line signal DLB from the pre-charge voltage potential VBLP, and a potential difference may appear between the first digit line signal DLT and the second digit line signal DLB during the pre-sense period of time 308. At the end of the pre-sense period of time 308 the N-type sense amplifier signal SAP, the N-type sense amplifier signal SAN, and the pre-charge control signal BLCP are de-asserted. Accordingly, the P-type common source line 208 is electrically isolated from the power high voltage potential line 224, the N-type common source line 206 is electrically isolated from the power low voltage potential line 226, the GUTT line 218 is electrically isolated from the second digit line 214, and the GUTB line 220 is electrically isolated from the first digit line 212.

With the GUTT line 218 electrically connected to the second digit line 214 and the GUTB line 220 electrically connected to the first digit line 212 during the pre-sense period of time 308, the drains of the Q5 and Q6, which are cross-coupled with the pre-charge control signal BLCP asserted, are driven to substantially the same voltage potentials as their gates. With the drains of transistors Q5 and Q6 coupled to their gates, transistors Q5 and Q6 will operate in the saturation mode. Accordingly, once the digit lines (first digit line 212, second digit line 214) have charged/discharged, the gate to source voltages of transistors Q5 and Q6 will be greater than or equal to the threshold voltages of transistors Q5 and Q6, regardless of any mismatch between the threshold voltages of transistors Q5 and Q6. Accordingly, the sense amplifier circuitry 200 is configured to compensate for any mismatch between threshold voltage potentials of transistors Q5 and Q6.

Following the pre-sense period of time 308 the word line signal WL may be asserted in the memory cell connection period of time 310, selecting a memory cell corresponding to the word line and electrically connecting the memory cell to the first digit line 212. Charge stored by the memory cell may discharge to the first digit line 212 during the memory cell connection period of time 310, and the memory cell voltage potential CELL and the first digit line signal DLT may converge. In the example of FIG. 3 the first digit line signal DLT increases and the memory cell voltage potential CELL decreases.

In the amplification period of time 312 the sense amplifier isolation signal ISO, the P-type sense amplifier isolation signal SAP, and the N-type sense amplifier isolation signal SAN are asserted. Accordingly, the GUTT line 218 is electrically connected to the first digit line 212, the GUTB line 220 is electrically connected to the second digit line 214, the P-type common source line 208 is electrically connected to the power high voltage potential line 224, and the N-type common source line 206 is electrically connected to the power low voltage potential line 226. Consequently, the pull-up sense amplifier 204 and the pull-down sense amplifier 202 are powered and connected to the first digit line 212 and the second digit line 214. The pull-up sense amplifier 204 and the pull-down sense amplifier 202 may amplify the first digit line signal DLT and the second digit line signal DLB. Accordingly, the cell voltage potential CELL and the first digit line voltage potential are driven to a high logic level, and the second digit line is driven to a low logic level during the amplification period of time 312.

With the first digit line signal DLT and the second digit line signal DLB amplified, the a potential difference across the first digit line 212 and the second digit line 214 may be read during the read period of time 314 to take a reading of the memory cell.

Figure 4:
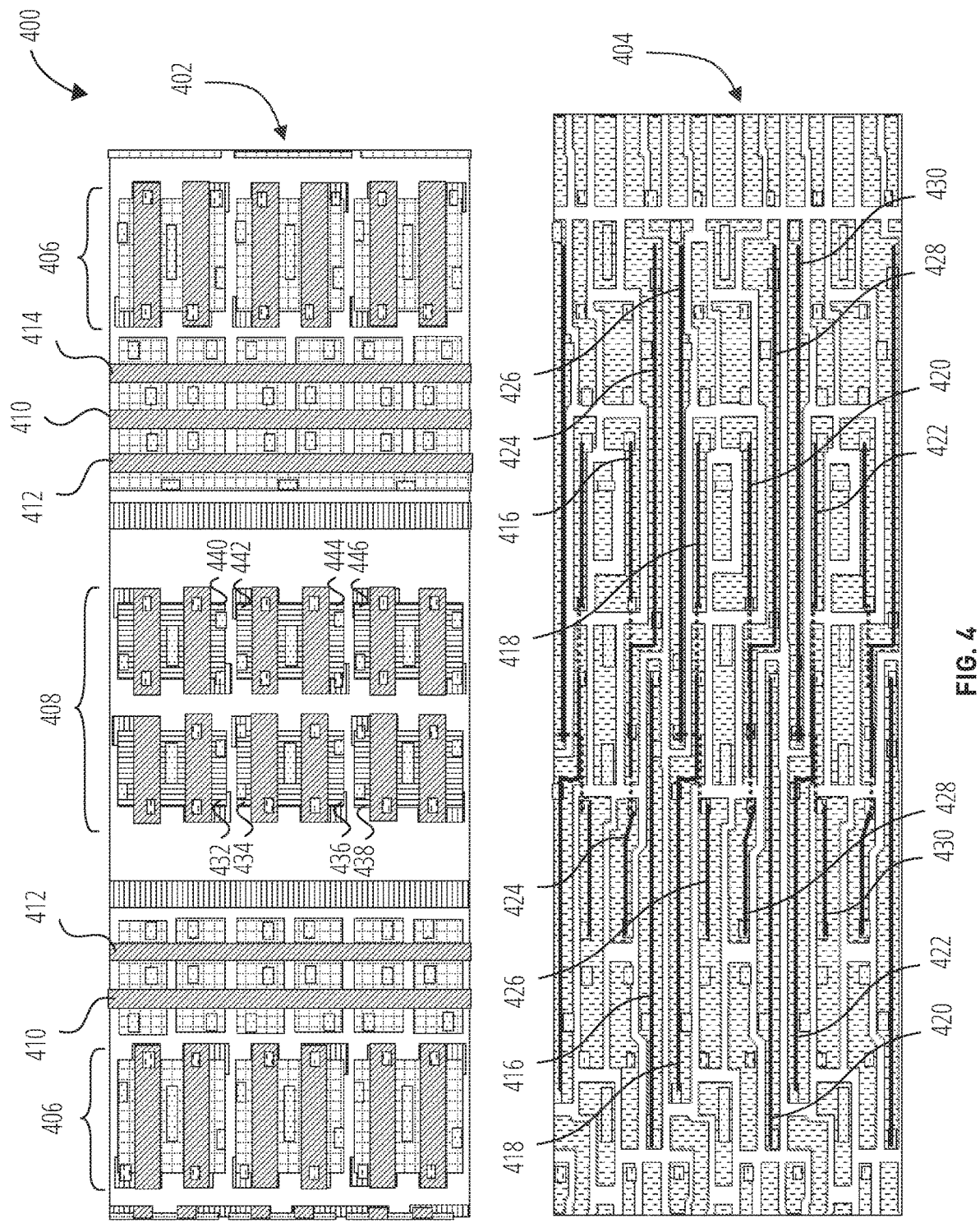
FIG. 4 is an example semiconductor chip layout for the sense amplifier circuitry of FIG. 2, according to a first embodiment.

FIG. 4 is an example semiconductor chip layout 400 for the sense amplifier circuitry 200 of FIG. 2, according to a first embodiment. Dimensions of features of the semiconductor chip layout 400 may correspond to a minimum processing size. The semiconductor chip layout 400 includes first layers 402 and second layers 404. The first layers 402 include PMOS diffusion material (shaded with vertical hatching), NMOS diffusion material (shaded with vertical and horizontal dotted hatching), gate material (shaded with diagonal hatching), electrode material (shaded with horizontal hatching), contact plug material (shaded using dotted shading) between diffusion material (PMOS or NMOS) and metal material, and contact plug material (shaded using horizontal dashed hatching) between gate material and the metal material. The second layers 404 include the metal material (shaded using vertical dashed hatching) and the contact plug materials of the first layers 402. Accordingly, the first layers 402 and the second layers 404 both illustrated the contact plug materials.

The semiconductor chip layout 400 includes structures for the sense amplifier circuitry 200 of FIG. 2. More specifically, the semiconductor chip layout 400 may embody multiple instances of portions of the sense amplifier circuitry 200 of FIG. 2 for multiple sense amplifiers. Accordingly, the semiconductor chip layout 400 includes repeating patterns of structures. For example, the semiconductor chip layout 400 includes Pull-down sense amplifiers 406, Pull-up sense amplifiers 408, digit line pre-charge control BLCP lines 410, sense amplifier isolation lines 412, and digit line pre-charge control BLPR line 414, corresponding to the pull-down sense amplifier 202, the pull-up sense amplifier 204, the digit line pre-charge control line 210 (BLCP), the sense amplifier isolation line 216 (ISO), and the digit line pre-charge control line 232 (BLPR) of FIG. 2.

Illustrated over the second layers 404 are GUTT and GUTB lines showing routing of multiple instances of the GUTT line 218 and the GUTB line 220 of the sense amplifier circuitry 200 of FIG. 2 for multiple sense amplifiers. For example, the GUTB lines of the second layers 404 include a GUT0B line 416, a GUT2B line 418, a GUT4B line 420, a GUT6B line 422, a GUT0T line 424, a GUT2T line 426, a GUT4T line 428, and a GUT6T line 430. Although these GUTT and GUTB lines are actually implemented using the metal material (vertical dashed hatching) and the gate material (diagonal hatching), these lines are illustrated over the second layers 404 to more clearly show how these lines are laid out. For each of these GUTT and GUTB lines, portions illustrated in solid line correspond to the metal material and portions illustrated in dotted line correspond to gate material. The GUT0B line 416 and the GUT0T line 424 may be for a first sense amplifier, the GUT2B line 418 and the GUT2T line 426 may be for a second sense amplifier, the GUT4B line 420 and the GUT4T line 428 may be for a third sense amplifier, and the GUT6B line 422 and the GUT6T line 430 may be for a fourth sense amplifier.

As may be observed by inspecting FIG. 4, the GUT0T line 424 and the GUT2T line 426, the GUT4T line 428 and the GUT6T line 430, the GUT0B line 416 and the GUT2T line 426, and the GUT4B line 420 and the GUT6B line 422 run side-by-side for relatively long distances. Accordingly, running distances between the GUT lines of the semiconductor chip layout 400 may not be equalized. In contrast to digit lines (not shown), which may be separated by sense amplifier isolation lines, these side-by-side GUTT and GUTB lines may not be electrically shielded from each other. As a result of relatively long, unshielded parallel running distances of the GUTT and GUTB lines, capacitive coupling between adjacent GUTT lines and between adjacent GUTB lines may be relatively large. A noise level between GUTT lines may be relatively high during sensing, which may have a relatively large impact on read operations. As a result, a relatively high rate signal defects in the GUTT lines and the GUTB lines may occur.

Wiring twists have been introduced to the GUTT lines and the GUTB lines in a region of the Pull-up sense amplifiers 408. As used herein, the term "wiring twist" refers to a crossover of routing of a GUTT line and a GUTB line of a sense amplifier. For example, to the left of the region of the Pull-up sense amplifiers 408 the GUT0T line 424 is above the GUT0B line 416. As the GUT0T line 424 and the GUT0B line 416 extend from left to right, however, at the right side of the region of the Pull-up sense amplifiers 408 the positions of the GUT0T line 424 and the GUT0B line 416 cross over, and to the right of the Pull-up sense amplifiers 408 the GUT0B line 416 is above the GUT0T line 424. Accordingly, a wiring twist of the GUT0T line 424 and the GUT0B line 416 is located in the right half of the region of the Pull-up sense amplifiers 408. A similar right half wiring twist of the GUT4T line 428 and the GUT4B line 420 is also shown in FIG. 4. A wiring twist of the GUT2T line 426 and the GUT2B line 418 is located in the left half of the region of the Pull-up sense amplifiers 408. Likewise, a wiring twist of the GUT0T line 430 and the GUT0B line 422 is located in the left half of the region of the Pull-up sense amplifiers 408.

In the semiconductor chip layout 400 of FIG. 4, PMOS diffusion materials (vertical hatching) facing each other (PMOS diffusion materials of adjacent sense amplifiers in the semiconductor chip layout 400) are electrically connected to the same type of GUT line (i.e., GUT0T line 424 and GUT2T line 426 are both GUTT lines, and GUT0B line 416 and GUT2B line 418 are both GUTB lines). For example, a first PMOS diffusion material 432 faces a second PMOS diffusion material 434. The first PMOS diffusion material 432 is electrically connected to GUT0B line 416 and the second PMOS diffusion material 434 is electrically connected to GUT2B line 418. As a result, both the first PMOS diffusion material 432 and the second PMOS diffusion material 434, which face each other, are electrically connected to the same type of GUT line (GUTT). Similarly, a third PMOS diffusion material 436 faces a fourth PMOS diffusion material 438. The third PMOS diffusion material 436 is electrically connected to the GUT4B line 420 and the fourth PMOS diffusion material 438 is electrically connected to the GUT6B line 422. As a result, both the third PMOS diffusion material 436 and the fourth PMOS diffusion material 438, which face each other, are electrically connected to the same type of GUT6B line 422 line (GUTB). Also, a fifth PMOS diffusion material 440 and a sixth PMOS diffusion material 442, which face each other, are both electrically connected to a GUTT lines (i.e., GUT0T line 424 and GUT2T line 426, respectively). Furthermore, a seventh PMOS diffusion material 444 and an eighth PMOS diffusion material 446, which face each other, are both electrically connected to GUTT lines (i.e., GUT4T line 428 and GUT6T line 430, respectively).

It is noted that the use of terms indicating relative position with respect to semiconductor chip layouts herein such as "left," "right," "above," and "below" are used with reference to the particular view illustrated in the figures. It will be apparent that if the orientation of a semiconductor chip layout is changed, the terms indicating relative position would also change.

Figure 5:
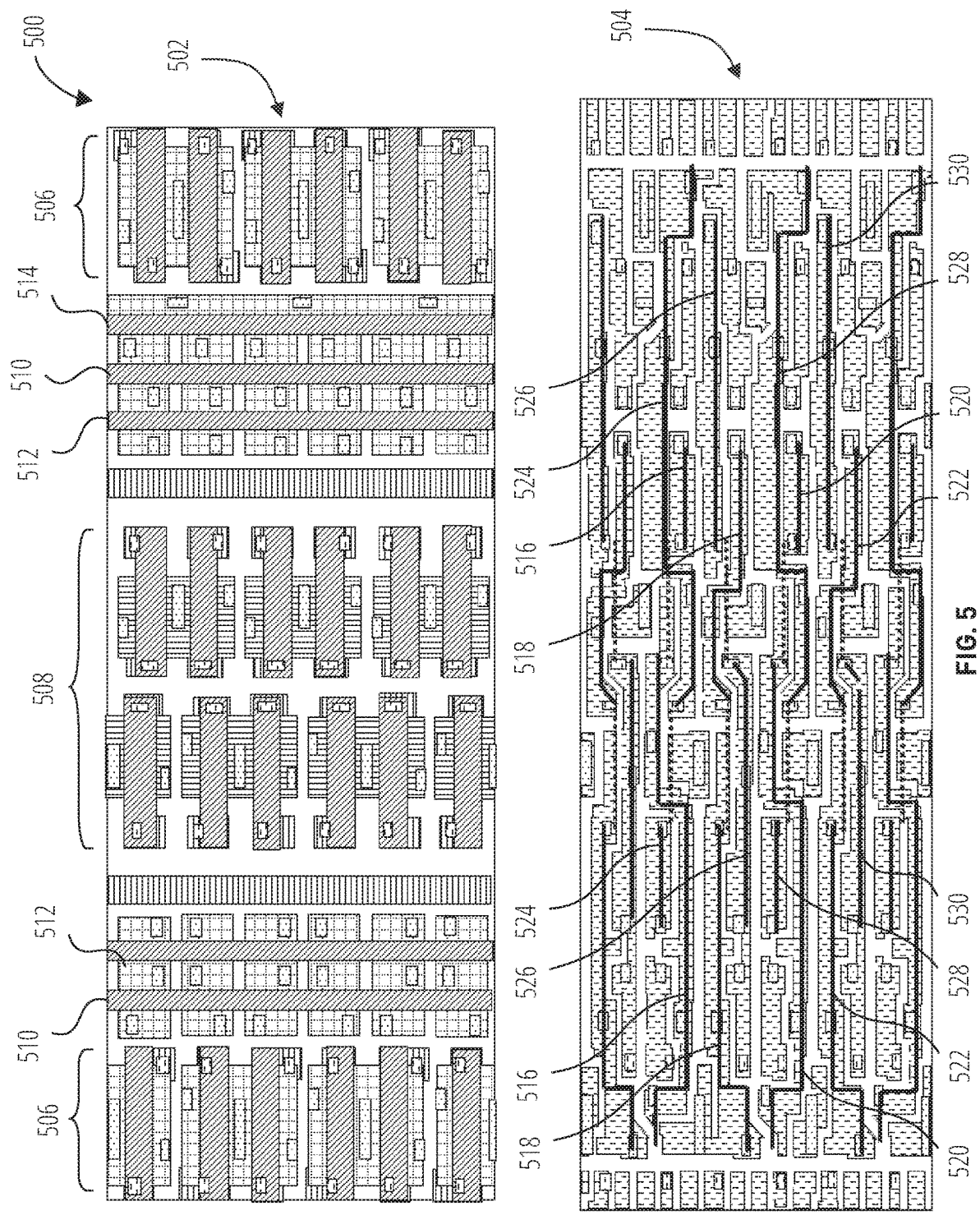
FIG. 5 is an example semiconductor chip layout for the sense amplifier circuitry of FIG. 2, according to a second embodiment.

FIG. 5 is an example semiconductor chip layout 500 for the sense amplifier circuitry 200 of FIG. 2, according to a second embodiment. Similar to the first layers 402 and second layers 404 of the semiconductor chip layout 400 of FIG. 4, the semiconductor chip layout 500 includes first layers 502 and second layers 504 indicated by like hatching as that discussed with reference to FIG. 4.

The semiconductor chip layout 500 includes features of multiple sense amplifiers, each of which includes the sense amplifier circuitry 200 of FIG. 2. For example, the semiconductor chip layout 500 includes Pull-down sense amplifiers 506, Pull-up sense amplifiers 508, digit line pre-charge control BLCP lines 510, sense amplifier isolation lines 512, and digit line pre-charge control BLPR line 514 corresponding to the pull-down sense amplifier 202, the pull-up sense amplifier 204, the digit line pre-charge control line 210, the sense amplifier isolation line 216, and the digit line pre-charge control line 232, respectively, of FIG. 2.

GUT lines corresponding to the GUTB line 220 and the GUTT line 218 of the sense amplifier circuitry 200 of FIG. 2 for each of the sense amplifiers are also illustrated on the second layers 504. For example, the semiconductor chip layout 500 includes GUT0B line 516, GUT2B line 518, GUT4B line 520, GUT6B line 522, GUT0T line 524, GUT2T line 526, GUT4T line 528, and GUT6T line 530.

Noise may be reduced, as compared to that of FIG. 4, on the GUT lines by including wiring twists in the GUT lines in a specific configuration to create a layout where noise is evenly generated on the GUTB and GUTT lines. For example, the GUT lines for a first sense amplifier (GUT0B line 516 and GUT0T line 524) and a third sense amplifier (GUT4B line 520 and GUT4T line 528) have two wiring twists in a region of the Pull-up sense amplifiers 508, one on a left side of the region of the Pull-up sense amplifiers 508 and the other on a right side of the region of the Pull-up sense amplifiers 508. The GUT lines for a second sense amplifier (GUT2B line 518 and GUT2T line 526) and a fourth sense amplifier (GUT0B line 522 and GUT0T line 530) have one twist in a region of the Pull-up sense amplifiers 508 (on the right side of the region of the Pull-up sense amplifiers 508). By including these wiring twists between the GUTB lines and the GUTT lines in the region of the Pull-up sense amplifiers 508, the parallel running distances between GUTB lines and GUTT lines is equalized.

In contrast to the semiconductor chip layout 400 of FIG. 4, in which the PMOS diffusion materials facing each other are electrically connected to the same type of GUT lines, the PMOS diffusion materials facing each other in the semiconductor chip layout 500 are electrically connected to different types of GUT lines. For example, PMOS diffusion materials that are electrically connected to GUTB lines face PMOS diffusion materials that are electrically connected to GUTT lines. Accordingly, the GUTB and GUTT lines are equalized even when the PMOS diffusion materials face each other.

Figure 6:
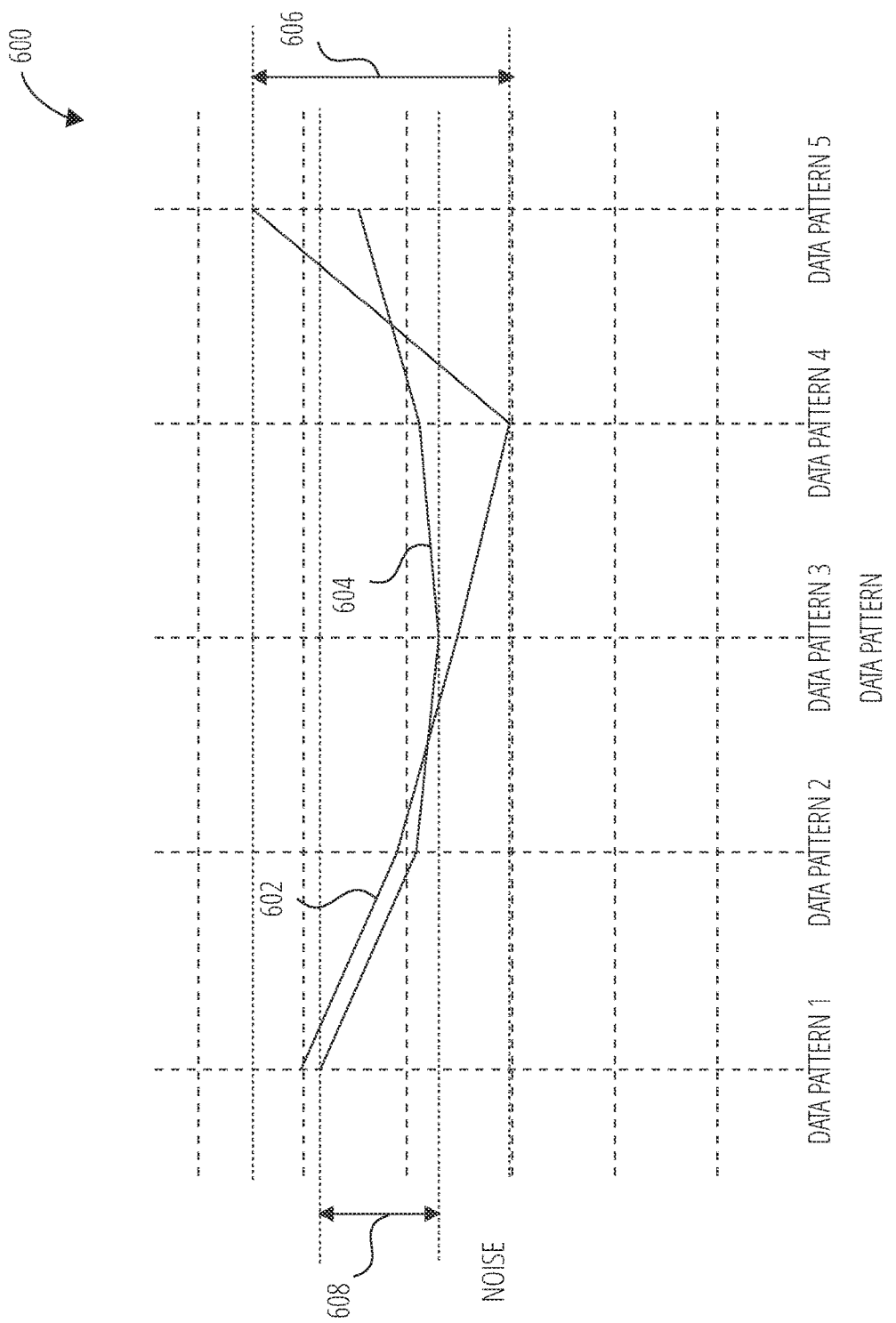
FIG. 6 is a plot comparing noise resulting from the semiconductor chip layout of FIG. 4 to noise resulting from the semiconductor chip layout of FIG. 5.

Due to the equalization of the GUT lines of the semiconductor chip layout 500, noise is reduced in the semiconductor chip layout 500 as compared to that of the semiconductor chip layout 400 of FIG. 4. FIG. 6 illustrates this noise reduction of the semiconductor chip layout 500 as compared to that of the semiconductor chip layout 400.

FIG. 6 is a plot 600 comparing noise 602 resulting from the semiconductor chip layout 400 of FIG. 4 to noise 604 resulting from the semiconductor chip layout 500 of FIG. 5. The noise 602 and the noise 604 are plotted over various different data patterns (DATA PATTERN 1, DATA PATTERN 2, DATA PATTERN 3, DATA PATTERN 4, and DATA PATTERN 5) applied to the GUT lines.

As may be seen in the plot 600, the noise 602 corresponding to the semiconductor chip layout 400 of FIG. 4 varies over a larger noise range 606 than a noise range 608. In fact, the noise range 608 corresponding to the semiconductor chip layout 500 is reduced about forty-seven percent (47%) as compared to the noise range 606 corresponding to the semiconductor chip layout 400 of FIG. 4. As a result, noise dependence on the applied data pattern of the semiconductor chip layout 500 of FIG. 5 is reduced as compared to that of the semiconductor chip layout 400 of FIG. 4. This more uniform noise range 606 of the semiconductor chip layout 500 may result from the equalization of parallel running distances between GUTB and GUTT lines.

Figure 7:
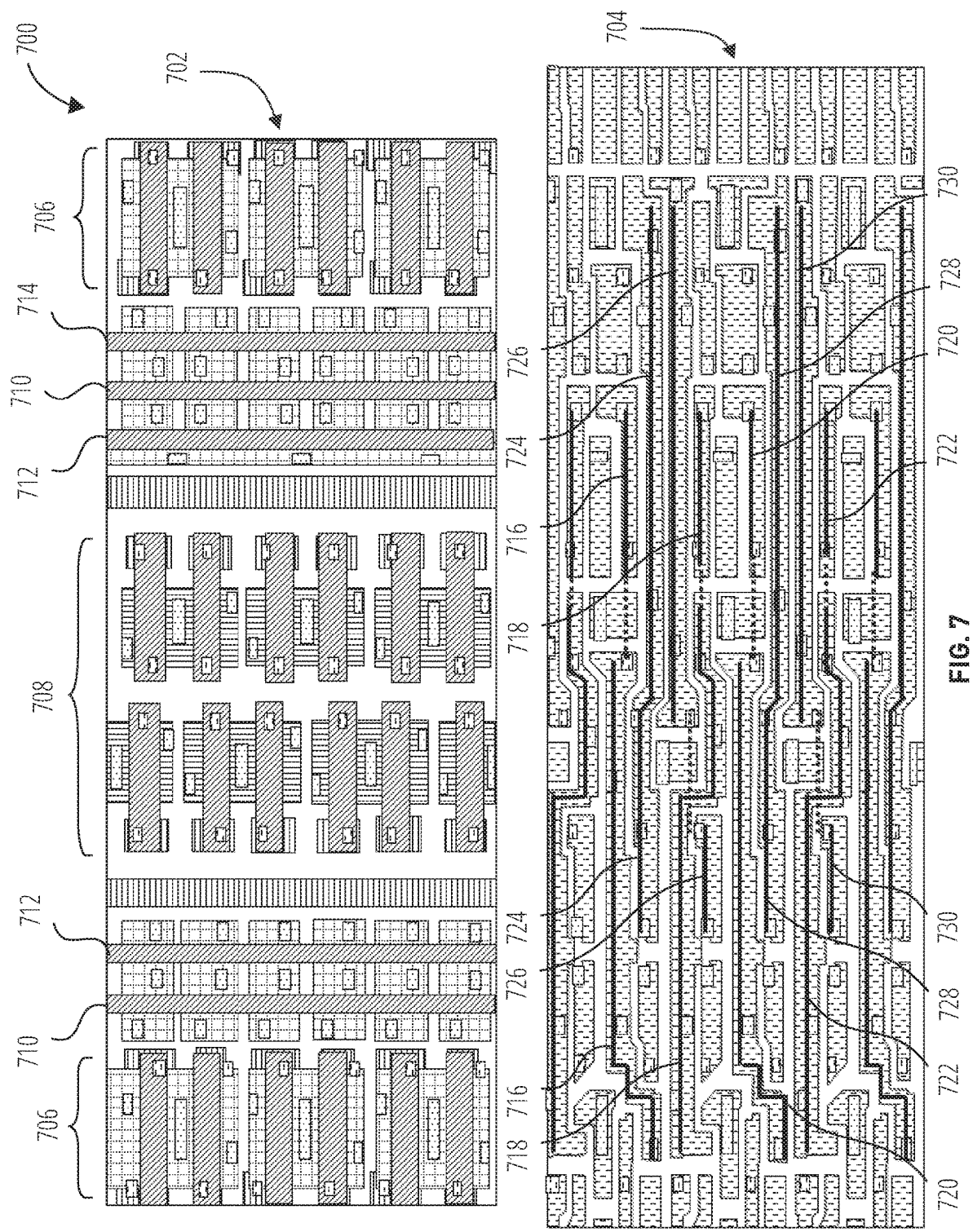
FIG. 7 is an example semiconductor chip layout for the sense amplifier circuitry of FIG. 2, according to a third embodiment.

FIG. 7 is an example semiconductor chip layout 700 for the sense amplifier circuitry 200 of FIG. 2, according to a third embodiment. Similar to the first layers 402 and second layers 404 of the semiconductor chip layout 400 of FIG. 4, the semiconductor chip layout 700 includes first layers 702 and second layers 704 indicated by like hatching as that discussed with reference to FIG. 4.

The semiconductor chip layout 700 includes features of multiple sense amplifiers, each of which includes the sense amplifier circuitry 200 of FIG. 2. For example, the semiconductor chip layout 700 includes Pull-down sense amplifiers 706, Pull-up sense amplifiers 708, digit line pre-charge control BLCP lines 710, sense amplifier isolation lines 712, and digit line pre-charge control BLPR line 714 corresponding to the pull-down sense amplifier 202, the pull-up sense amplifier 204, the digit line pre-charge control line 210, the sense amplifier isolation line 216, and the digit line pre-charge control line 232, respectively, of FIG. 2.

GUT lines corresponding to the GUTB line 220 and the GUTT line 218 of the sense amplifier circuitry 200 of FIG. 2 for each of the sense amplifiers are also illustrated on the second layers 704. For example, the semiconductor chip layout 700 includes GUT0B line 716, GUT2B line 718, GUT4B line 720, GUT6B line 722, GUT0T line 724, GUT2T line 726, GUT4T line 728, and GUT6T line 730.

Noise may be reduced, as compared to that of the semiconductor chip layout 400 of FIG. 4, on the GUT lines by including wiring twists in the GUT lines in a specific configuration to create a layout where noise is more evenly generated on the GUTB and GUTT lines. The GUT lines for a first sense amplifier (GUT0B line 716 and the GUT0T line 724) and a third sense amplifier (GUT4B line 720 and GUT4T line 728) have no wiring twists in a region of the Pull-up sense amplifiers 708. The GUT lines for a second sense amplifier (GUT2B line 718 and GUT2T line 726) and a fourth sense amplifier (GUT6B line 722 and GUT6T line 730), however, have one twist in a region of the Pull-up sense amplifiers 708 (on the left side of the region of the Pull-up sense amplifiers 708). By including these wiring twists between the GUTB lines and the GUTT lines in the region of the Pull-up sense amplifiers 708, the parallel running distances between GUTB lines and GUTT lines (e.g., between the GUT0B line 716 and the GUT2B line 718 and between the GUT4B line 720 and the GUT6B line 722) is more equalized than those of the semiconductor chip layout 400 of FIG. 4. Due to the equalization of the GUT lines of the semiconductor chip layout 700, noise is reduced in the semiconductor chip layout 700 as compared to that of the semiconductor chip layout 400 of FIG. 4.

Similar to the semiconductor chip layout 400 of FIG. 4, in which the PMOS diffusion materials facing each other are electrically connected to the same type of GUT lines, the PMOS diffusion materials facing each other in the semiconductor chip layout 700 are electrically connected to the same types of GUT lines. For example, PMOS diffusion materials that are electrically connected to GUTB lines face PMOS diffusion materials that are electrically connected to GUTB lines, and PMOS diffusion materials that are electrically connected to GUTT lines face PMOS diffusion materials that are electrically connected to GUTT lines.

Figure 8:
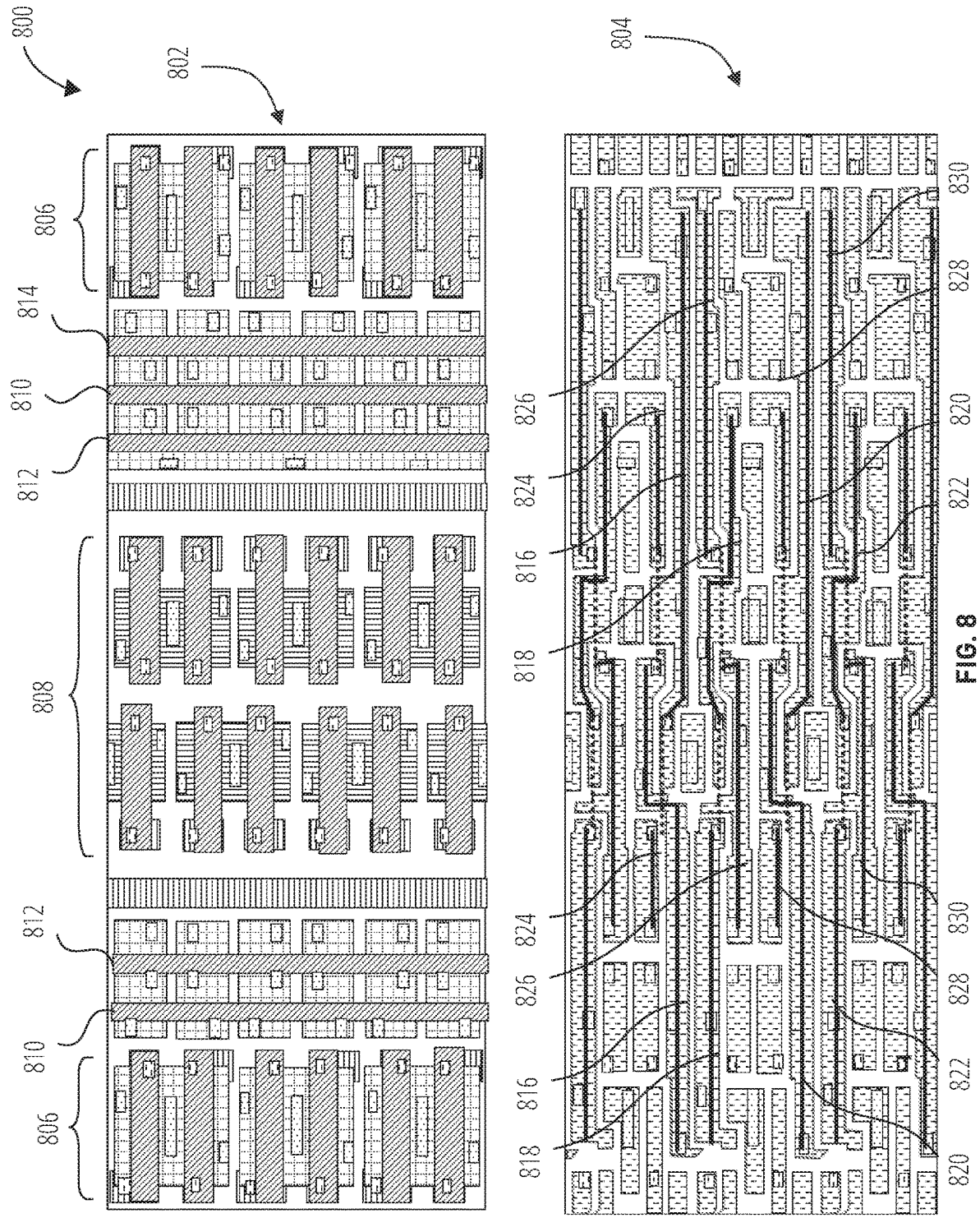
FIG. 8 is an example semiconductor chip layout for the sense amplifier circuitry of FIG. 2, according to a fourth embodiment.

FIG. 8 is an example semiconductor chip layout 800 for the sense amplifier circuitry 200 of FIG. 2, according to a fourth embodiment. Similar to the first layers 402 and second layers 404 of the semiconductor chip layout 400 of FIG. 4, the semiconductor chip layout 800 includes first layers 802 and second layers 804 indicated by like hatching as that discussed with reference to FIG. 4.

The semiconductor chip layout 800 includes features of multiple sense amplifiers, each of which includes the sense amplifier circuitry 200 of FIG. 2. For example, the semiconductor chip layout 800 includes Pull-down sense amplifiers 806, Pull-up sense amplifiers 808, digit line pre-charge control BLCP lines 810, sense amplifier isolation lines 812, and digit line pre-charge control BLPR line 814 corresponding to the pull-down sense amplifier 202, the pull-up sense amplifier 204, the digit line pre-charge control line 210, the sense amplifier isolation line 216, and the digit line pre-charge control line 232, respectively, of FIG. 2.

GUT lines corresponding to the GUTB line 220 and the GUTT line 218 of the sense amplifier circuitry 200 of FIG. 2 for each of the sense amplifiers are also illustrated on the second layers 804. For example, the semiconductor chip layout 800 includes GUT0B line 816, GUT2B line 818, GUT4B line 820, GUT6B line 822, GUT0T line 824, GUT2T line 826, GUT4T line 828, and GUT0T line 830.

Noise may be reduced, as compared to that of the semiconductor chip layout 400 of FIG. 4, on the GUT lines by including wiring twists in the GUT lines in a specific configuration to create a layout where noise is more evenly generated on the GUTB and GUTT lines. The GUT lines for a first sense amplifier (GUT0B line 816 and the GUT0T line 824) and a third sense amplifier (GUT4B line 820 and GUT4T line 828) have one wiring twist in a region of the Pull-up sense amplifiers 808 (on the left side of the region of the Pull-up sense amplifiers 808). Also, the GUT lines for a second sense amplifier (GUT2B line 818 and GUT2T line 826) and a fourth sense amplifier (GUT6B line 822 and GUT0T line 830) have one twist in a region of the Pull-up sense amplifiers 808 (on the right side of the region of the Pull-up sense amplifiers 808). By including these wiring twists between the GUTB lines and the GUTT lines in the region of the Pull-up sense amplifiers 808, the parallel running distances between GUTB lines and GUTT lines (e.g., between the GUT0B line 816 and the GUT2B line 818 and between the GUT4B line 820 and the GUT6B line 822) is shortened and more equalized than those of the semiconductor chip layout 400 of FIG. 4. Due to the equalization of the GUT lines of the semiconductor chip layout 800, noise is reduced in the semiconductor chip layout 800 as compared to that of the semiconductor chip layout 400 of FIG. 4.

In contrast to the semiconductor chip layout 400 of FIG. 4, in which the PMOS diffusion materials facing each other are electrically connected to the same type of GUT lines, the PMOS diffusion materials facing each other in the semiconductor chip layout 700 are electrically connected to the different types of GUT lines. For example, PMOS diffusion materials that are electrically connected to GUTB lines face PMOS diffusion materials that are electrically connected to GUTT lines.

Figure 9:
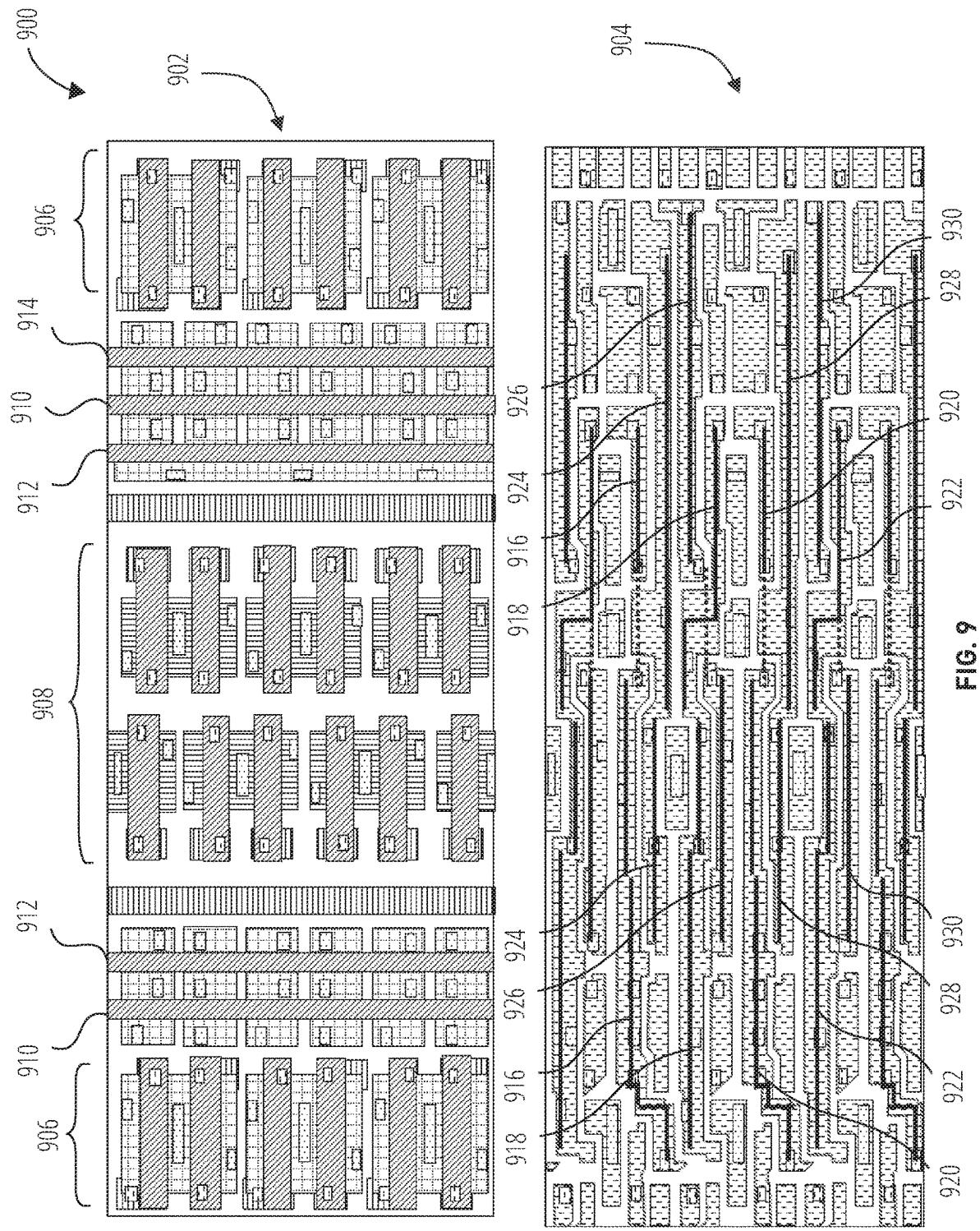
FIG. 9 is an example semiconductor chip layout for the sense amplifier circuitry of FIG. 2, according to a fifth embodiment.

FIG. 9 is an example semiconductor chip layout 900 for the sense amplifier circuitry 200 of FIG. 2, according to a fifth embodiment. Similar to the first layers 402 and second layers 404 of the semiconductor chip layout 400 of FIG. 4, the semiconductor chip layout 900 includes first layers 902 and second layers 904 indicated by like hatching as that discussed with reference to FIG. 4.

The semiconductor chip layout 900 includes features of multiple sense amplifiers, each of which includes the sense amplifier circuitry 200 of FIG. 2. For example, the semiconductor chip layout 900 includes Pull-down sense amplifiers 906, Pull-up sense amplifiers 908, digit line pre-charge control BLCP lines 910, sense amplifier isolation lines 912, and digit line pre-charge control BLPR line 914 corresponding to the pull-down sense amplifier 202, the pull-up sense amplifier 204, the digit line pre-charge control line 210, the sense amplifier isolation line 216, and the digit line pre-charge control line 232, respectively, of FIG. 2.

GUT lines corresponding to the GUTB line 220 and the GUTT line 218 of the sense amplifier circuitry 200 of FIG. 2 for each of the sense amplifiers are also illustrated on the second layers 904. For example, the semiconductor chip layout 900 includes GUT0B line 916, GUT2B line 918, GUT4B line 920, GUT6B line 922, GUT0T line 924, GUT2T line 926, GUT4T line 928, and GUT6T line 930.

Noise may be reduced, as compared to that of the semiconductor chip layout 400 of FIG. 4, on the GUT lines by including wiring twists in the GUT lines in a specific configuration to create a layout where noise is more evenly generated on the GUTB and GUTT lines. The GUT lines for a first sense amplifier (GUT0B line 916 and the GUT0T line 924) and a third sense amplifier (GUT4B line 920 and GUT4T line 928) have no wiring twists in a region of the Pull-up sense amplifiers 908. The GUT lines for a second sense amplifier (GUT2B line 918 and GUT2T line 926) and a fourth sense amplifier (GUT6B line 922 and GUT6T line 930), however, have one twist in a region of the Pull-up sense amplifiers 908 (on the right side of the region of the Pull-up sense amplifiers 908). By including these wiring twists between the GUTB lines and the GUTT lines in the region of the Pull-up sense amplifiers 908, the parallel running distance of the GUTT and GUTB lines is more uniform than that of the semiconductor chip layout 400 of FIG. 4. Due to the equalization of the GUT lines of the semiconductor chip layout 900, noise is reduced in the semiconductor chip layout 900 as compared to that of the semiconductor chip layout 400 of FIG. 4.

In contrast to the semiconductor chip layout 400 of FIG. 4, in which the PMOS diffusion materials facing each other are electrically connected to the same type of GUT lines, the PMOS diffusion materials facing each other in the semiconductor chip layout 900 are electrically connected to the different types of GUT lines. For example, PMOS diffusion materials that are electrically connected to GUTB lines face PMOS diffusion materials that are electrically connected to GUTT lines.

Figure 10:
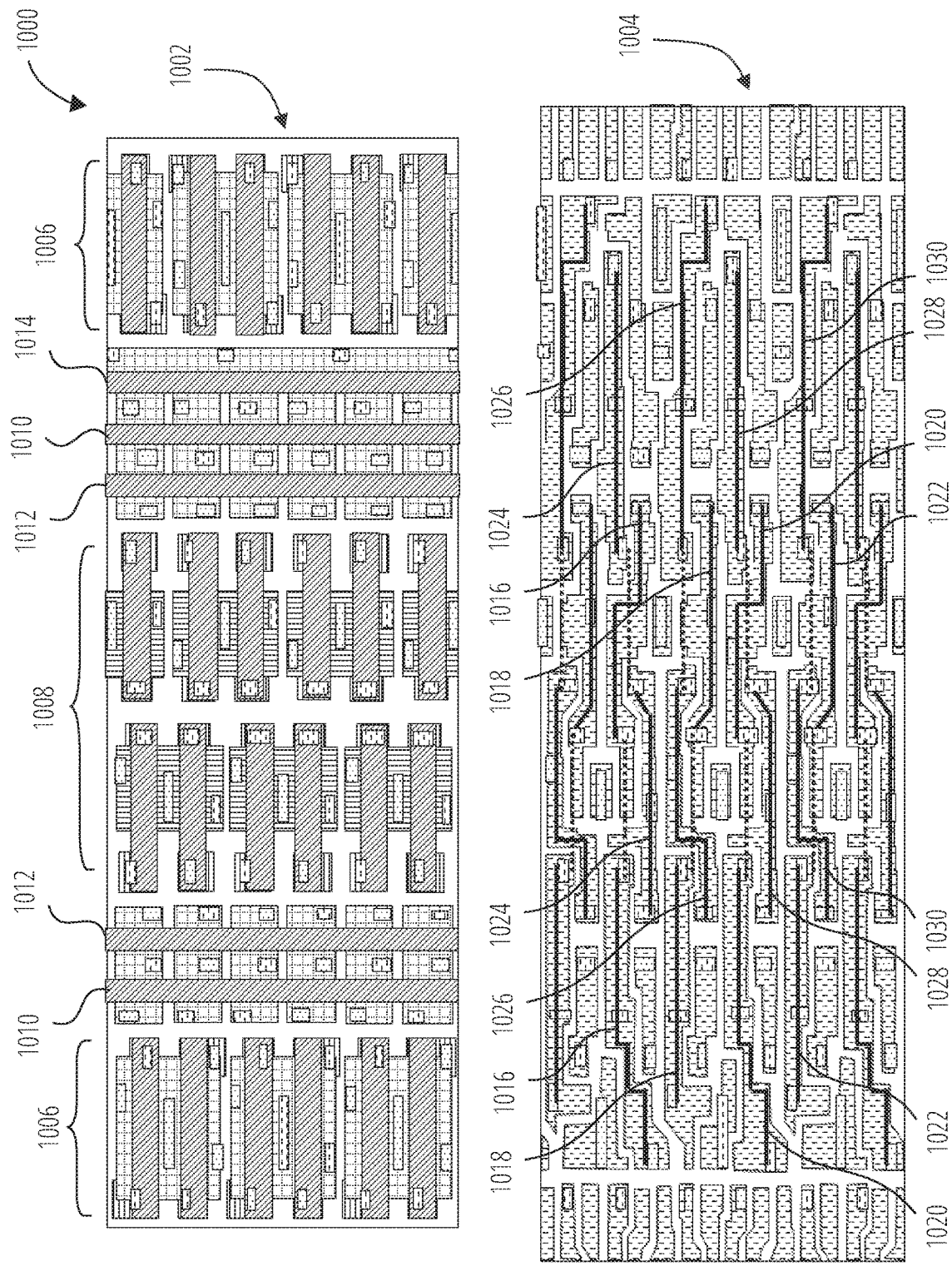
FIG. 10 is an example semiconductor chip layout for the sense amplifier circuitry of FIG. 2, according to a sixth embodiment.

FIG. 10 is an example semiconductor chip layout 1000 for the sense amplifier circuitry 200 of FIG. 2, according to a sixth embodiment. Similar to the first layers 402 and second layers 404 of the semiconductor chip layout 400 of FIG. 4, the semiconductor chip layout 1000 includes first layers 1002 and second layers 1004 indicated by like hatching as that discussed with reference to FIG. 4.

The semiconductor chip layout 1000 includes features of multiple sense amplifiers, each of which includes the sense amplifier circuitry 200 of FIG. 2. For example, the semiconductor chip layout 1000 includes Pull-down sense amplifiers 1006, Pull-up sense amplifiers 1008, digit line pre-charge control BLCP lines 1010, sense amplifier isolation lines 1012, and digit line pre-charge control BLPR line 1014 corresponding to the pull-down sense amplifier 202, the pull-up sense amplifier 204, the digit line pre-charge control line 210, the sense amplifier isolation line 216, and the digit line pre-charge control line 232, respectively, of FIG. 2.

GUT lines corresponding to the GUTB line 220 and the GUTT line 218 of the sense amplifier circuitry 200 of FIG. 2 for each of the sense amplifiers are also illustrated on the second layers 1004. For example, the semiconductor chip layout 1000 includes GUT0B line 1016, GUT2B line 1018, GUT4B line 1020, GUT6B line 1022, GUT0T line 1024, GUT2T line 1026, GUT4T line 1028, and GUT6T line 1030.

Noise may be reduced, as compared to that of the semiconductor chip layout 400 of FIG. 4, on the GUT lines by including wiring twists in the GUT lines in a specific configuration to create a layout where noise is more evenly generated on the GUTB and GUTT lines. The GUT lines for a first sense amplifier (GUT0B line 1016 and the GUT0T line 1024) and a third sense amplifier (GUT4B line 1020 and GUT4T line 1028) have one wiring twist in a region of the Pull-up sense amplifiers 1008 (on the right side of the region of the Pull-up sense amplifiers 1008). Also, the GUT lines for a second sense amplifier (GUT2B line 1018 and GUT2T line 1026) and a fourth sense amplifier (GUT6B line 1022 and GUT6T line 1030) have one twist in a region of the Pull-up sense amplifiers 1008 (on the left side of the region of the Pull-up sense amplifiers 1008). By including these wiring twists between the GUTB lines and the GUTT lines in the region of the Pull-up sense amplifiers 1008, the parallel running distances between GUTB lines and GUTT lines (e.g., between the GUT0B line 1016 and the GUT2B line 1018 and between the GUT4B line 1020 and the GUT6B line 1022) is shortened and more equalized than those of the semiconductor chip layout 400 of FIG. 4. Due to the equalization of the GUT lines of the semiconductor chip layout 1000, noise is reduced in the semiconductor chip layout 1000 as compared to that of the semiconductor chip layout 400 of FIG. 4.

Similar to the semiconductor chip layout 400 of FIG. 4, in which the PMOS diffusion materials facing each other are electrically connected to the same type of GUT lines, the PMOS diffusion materials facing each other in the semiconductor chip layout 1000 are electrically connected to the same types of GUT lines. For example, PMOS diffusion materials that are electrically connected to GUTB lines face PMOS diffusion materials that are electrically connected to GUTB lines, and PMOS diffusion materials that are electrically connected to GUTT lines face PMOS diffusion materials that are electrically connected to GUTT lines.

Figure 11:
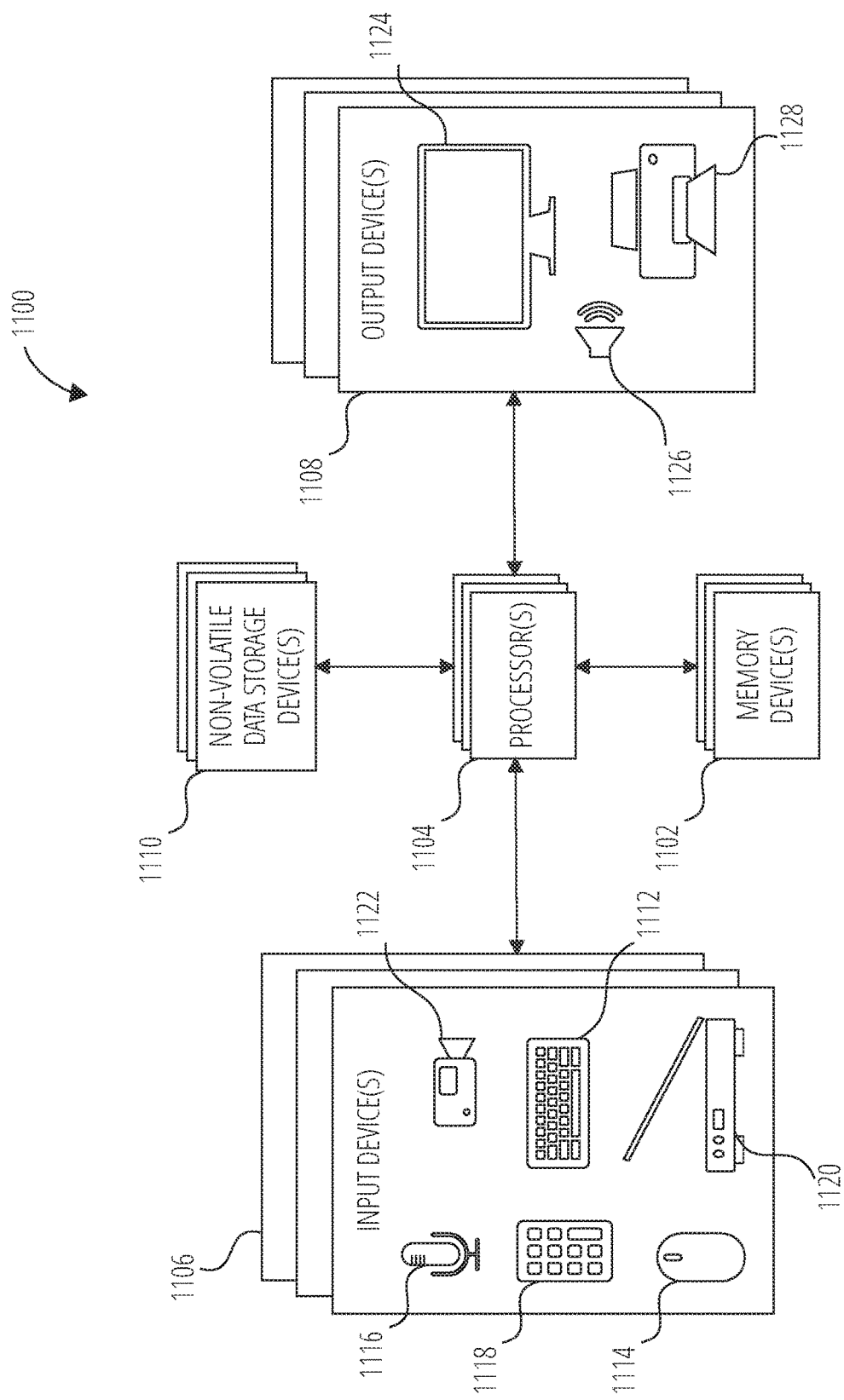
FIG. 11 is a block diagram of a computing system, according to some embodiments.

FIG. 11 is a block diagram of a computing system 1100, according to some embodiments. The computing system 1100 includes one or more processors 1104 operably coupled to one or more memory devices 1102, one or more non-volatile data storage devices 1110, one or more input devices 1106, and one or more output devices 1108. In some embodiments the computing system 1100 includes a personal computer (PC) such as a desktop computer, a laptop computer, a tablet computer, a mobile computer (e.g., a smartphone, a personal digital assistant (PDA), etc.), a network server, or other computer device.

In some embodiments the one or more processors 1104 may include a central processing unit (CPU) or other processor configured to control the computing system 1100. In some embodiments the one or more memory devices 1102 include random access memory (RAM), such as volatile data storage (e.g., dynamic RAM (DRAM) static RAM (SRAM), etc.). In some embodiments the one or more memory devices 1102 include the portion 100 of the memory device of FIG. 1. In some embodiments the one or more memory devices 1102 include the sense amplifier circuitry 200 of FIG. 2. In some embodiments the one or more memory devices 1102 may include sense amplifier circuitry laid out as illustrated in the semiconductor chip layout 400 of FIG. 4, the semiconductor chip layout 500 of FIG. 5, the semiconductor chip layout 700 of FIG. 7, the semiconductor chip layout 800 of FIG. 8, the semiconductor chip layout 900 of FIG. 9, or the semiconductor chip layout 1000 of FIG. 10.

In some embodiments the one or more non-volatile data storage devices 1110 include a hard drive, a solid state drive, Flash memory, erasable programmable read only memory (EPROM), other non-volatile data storage devices, or any combination thereof. In some embodiments the one or more input devices 1106 include a keyboard 1112, a pointing device 1114 (e.g., a mouse, a track pad, etc.), a microphone 1116, a keypad 1118, a scanner 1120, a camera 1122, other input devices, or any combination thereof. In some embodiments the output devices 1108 include an electronic display 1124, a speaker 1126, a printer 1128, other output devices, or any combination thereof.

As used in the present disclosure, the terms "module" or "component" may refer to specific hardware implementations configured to perform the actions of the module or component and/or software objects or software routines that may be stored on and/or executed by general purpose hardware (e.g., computer-readable media, processing devices, etc.) of the computing system. In some embodiments, the different components, modules, engines, and services described in the present disclosure may be implemented as objects or processes that execute on the computing system (e.g., as separate threads). While some of the system and methods described in the present disclosure are generally described as being implemented in software (stored on and/or executed by general purpose hardware), specific hardware implementations or a combination of software and specific hardware implementations are also possible and contemplated.

As used in the present disclosure, the term "combination" with reference to a plurality of elements may include a combination of all the elements or any of various different subcombinations of some of the elements. For example, the phrase "A, B, C, D, or combinations thereof" may refer to any one of A, B, C, or D; the combination of each of A, B, C, and D; and any subcombination of A, B, C, or D such as A, B, and C; A, B, and D; A, C, and D; B, C, and D; A and B; A and C; A and D; B and C; B and D; or C and D.

Terms used in the present disclosure and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

While the present disclosure has been described herein with respect to certain illustrated embodiments, those of ordinary skill in the art will recognize and appreciate that the present invention is not so limited. Rather, many additions, deletions, and modifications to the illustrated and described embodiments may be made without departing from the scope of the invention as hereinafter claimed along with their legal equivalents. In addition, features from one embodiment may be combined with features of another embodiment while still being encompassed within the scope of the invention as contemplated by the inventor.

What is claimed is:

1. An apparatus, comprising:
    a first sense amplifier comprising:
        a first pull-up sense amplifier;
        a first pull-down sense amplifier; and
        a first pair of conductive lines electrically connecting the first pull-up sense amplifier to the first pull-down sense amplifier; and
    a second sense amplifier adjacent to the first sense amplifier, the second sense amplifier comprising:
        a second pull-up sense amplifier;
        a second pull-down sense amplifier; and
        a second pair of conductive lines electrically connecting the second pull-up sense amplifier to the second pull-down sense amplifier, parallel running distances between lines of the first pair of conductive lines and the second pair of conductive lines equalized by a wiring twist of at least one of the first pair of conductive lines and the second pair of conductive lines in a region of the first pull-up sense amplifier and the second pull-up sense amplifier.

2. The apparatus of claim 1, wherein the first pair of conductive lines includes two wiring twists in the region of the first pull-up sense amplifier and the second pull-up sense amplifier.

3. The apparatus of claim 2, wherein the second pair of conductive lines includes only one wiring twist in the region of the first pull-up sense amplifier and the second pull-up sense amplifier.

4. The apparatus of claim 1, wherein the first pair of conductive lines and the second pair of conductive lines each include complementary lines that are pre-charged prior to sensing digit lines.

5. The apparatus of claim 4, wherein diffusion materials of the first pull-up sense amplifier and the second pull-up sense amplifier that face each other are electrically connected to lines of complementary types.

6. The apparatus of claim 4, wherein diffusion materials of the first pull-up sense amplifier and the second pull-up sense amplifier that face each other are electrically connected to lines of the same type.

7. The apparatus of claim 1, wherein the first pair of conductive lines includes no wiring twists in the region of the first pull-up sense amplifier and the second pull-up sense amplifier.

8. The apparatus of claim 7, wherein the second pair of conductive lines includes only one wiring twist in the region of the first pull-up sense amplifier and the second pull-up sense amplifier.

9. The apparatus of claim 1, wherein the first pair of conductive lines includes only one wiring twist in the region of the first pull-up sense amplifier and the second pull-up sense amplifier.

10. The apparatus of claim 9, wherein the second pair of conductive lines includes only one wiring twist in the region of the first pull-up sense amplifier and the second pull-up sense amplifier.

11. The apparatus of claim 1, further comprising:
    a first pair of digit lines electrically connected to gates of transistors of the first pull-down sense amplifier; and
    a first pair of pre-charge transistors electrically connected between the first pair of digit lines and drains of the transistors of the first pull-down sense amplifier.

12. The apparatus of claim 11, further comprising a first pair of isolation transistors electrically connected between the first pair of digit lines and the drains of the transistors of the first pull-down sense amplifier.

13. An apparatus, comprising:
    a region of pull-up sense amplifiers comprising a first pull-up sense amplifier and a second pull-up sense amplifier;
    a region of pull-down sense amplifiers comprising a first pull-down sense amplifier and a second pull-down sense amplifier;
    a first conductive line electrically connecting the first pull-up sense amplifier to the first pull-down sense amplifier;
    a second conductive line electrically connecting the first pull-up sense amplifier to the first pull-down sense amplifier, the first conductive line and the second conductive line including two wiring twists between the first conductive line and the second conductive line in the region of the pull-up sense amplifiers;
    a third conductive line electrically connecting the second pull-up sense amplifier to the second pull-down sense amplifier; and
    a fourth conductive line electrically connecting the second pull-up sense amplifier to the second pull-down sense amplifier, the third conductive line and the fourth conductive line including only one wiring twist between the third conductive line and the fourth conductive line in the region of the pull-up sense amplifiers.

14. The apparatus of claim 13, wherein:
diffusion materials of the first pull-up sense amplifier and the second pull-up sense amplifier that are electrically connected to one of the first conductive line and the third conductive line face diffusion materials that are electrically connected to one of the second conductive line and the fourth conductive line.

15. A computing system, comprising:
one or more processors; and
one or more memory devices electrically connected to the one or more processors, the one or more memory devices including:
   a region of pull-up sense amplifiers comprising a first pull-up sense amplifier and a second pull-up sense amplifier;
   a region of pull-down sense amplifiers comprising a first pull-down sense amplifier and a second pull-down sense amplifier;
   a first conductive line and a second conductive line electrically connecting the first pull-up sense amplifier to the first pull-down sense amplifier; and
   a third conductive line and a fourth conductive line electrically connecting the second pull-up sense amplifier to the second pull-down sense amplifier, side-by-side running distances between the first conductive line, the second conductive line, the third conductive line and the fourth conductive line equalized by one or more wiring twists at least one of:
   between the first conductive line and the second conductive line; and
   between the third conductive line and the fourth conductive line.

16. The computing system of claim 15, wherein the one or more wiring twists are in the region of pull-up sense amplifiers.

17. The computing system of claim 15, wherein the one or more wiring twists include two wiring twists between the first conductive line and the second conductive line and a single wiring twist between the third conductive line and the fourth conductive line.

18. The computing system of claim 15, wherein the one or more wiring twists include no wiring twists between the first conductive line and the second conductive line and a single wiring twist between the third conductive line and the fourth conductive line.

19. The computing system of claim 15, wherein the one or more wiring twists include a single wiring twist between the first conductive line and the second conductive line and a single wiring twist between the third conductive line and the fourth conductive line.

20. The computing system of claim 15, further comprising:
   one or more non-volatile data storage devices electrically connected to the one or more processors;
   one or more input devices electrically connected to the one or more processors; and
   one or more output devices electrically connected to the one or more processors.

* * * * *

UNITED STATES PATENT AND TRADEMARK OFFICE
CERTIFICATE OF CORRECTION

PATENT NO. : 11,417,389 B2
APPLICATION NO. : 16/917233
DATED : August 16, 2022
INVENTOR(S) : Yuko Watanabe and Takefumi Shirako It is certified that error appears in the above-identified patent and that said Letters Patent is hereby corrected as shown below:

In the Specification

| | | |
|---|---|---|
| Column 12, | Line 30, | change "GUT0T" to --GUT6T-- |
| Column 12, | Line 30, | change "GUT0B" to --GUT6B-- |
| Column 13, | Line 41, | change "GUT0B" to --GUT6B-- |
| Column 13, | Line 41, | change "GUT0T" to --GUT6T-- |
| Column 15, | Line 35, | change "GUT0T" to --GUT6T-- |
| Column 15, | Line 48, | change "GUT0T" to --GUT6T-- |

Signed and Sealed this
Thirteenth Day of December, 2022

Katherine Kelly Vidal
*Director of the United States Patent and Trademark Office*